US012727395B2

(12) United States Patent
Yun et al.

(10) Patent No.: US 12,727,395 B2
(45) Date of Patent: Sep. 1, 2026

(54) SEMICONDUCTOR DEVICE AND METHOD FOR FABRICATING THE SAME

(71) Applicant: SK hynix Inc., Icheon-si (KR)

(72) Inventors: Jong Min Yun, Icheon-si (KR); Dae Eun Kwon, Icheon-si (KR); Soo Gil Kim, Icheon-si (KR); Soo Man Seo, Icheon-si (KR); Tae Jung Ha, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 545 days.

(21) Appl. No.: 18/313,248

(22) Filed: May 5, 2023

(65) Prior Publication Data

US 2024/0172569 A1 May 23, 2024

(30) Foreign Application Priority Data

Nov. 21, 2022 (KR) ........................ 10-2022-0156465

(51) Int. Cl.
*H10N 70/00* (2023.01)

(52) U.S. Cl.
CPC ......... *H10N 70/041* (2023.02); *H10N 70/063* (2023.02); *H10N 70/066* (2023.02); *H10N 70/841* (2023.02); *H10N 70/882* (2023.02)

(58) Field of Classification Search
CPC ... H10N 70/063; H10N 70/066; H10N 70/826
See application file for complete search history.

(56) References Cited

U.S. PATENT DOCUMENTS

| | | | | |
|---|---|---|---|---|
| 10,438,995 | B2 | 10/2019 | Kim et al. | |
| 11,011,576 | B2 * | 5/2021 | Jiang | H10N 70/063 |
| 12,464,961 | B2 * | 11/2025 | Shin | H10N 50/10 |
| 2017/0117328 | A1 * | 4/2017 | Terai | H10N 70/826 |
| 2019/0214429 | A1 * | 7/2019 | Kim | H10B 61/00 |
| 2020/0176674 | A1 * | 6/2020 | Luo | H10N 70/826 |
| 2022/0384725 | A1 * | 12/2022 | Jiang | H10B 63/20 |

* cited by examiner

*Primary Examiner* — Mounir S Amer
(74) *Attorney, Agent, or Firm* — Ashurst Perkins Coie US LLP

(57) ABSTRACT

A semiconductor device may include: a first conductive line extending in a first direction; a second conductive line disposed over the first conductive line to be spaced apart from the first conductive line and extending in a second direction different from the first direction; and a selector layer disposed between the first conductive line and the second conductive line and extending in a direction crossing at least one of the first direction or the second direction, wherein the selector layer includes a trench formed on a surface of the selector layer and extending in the direction crossing at least one of the first direction or the second direction.

10 Claims, 6 Drawing Sheets

SEMICONDUCTOR DEVICE AND METHOD FOR FABRICATING THE SAME

PRIORITY CLAIM AND CROSS-REFERENCE TO RELATED APPLICATION

This patent document claims the priority and benefits of Korean Patent Application No. 10-2022-0156465 filed on Nov. 21, 2022, which is incorporated herein by reference in its entirety.

TECHNICAL FIELD

This patent document relates to memory circuits or devices and their applications in semiconductor devices or systems.

BACKGROUND

The recent trend toward miniaturization, low power consumption, high performance, and multi-functionality in the electrical and electronics industry has compelled the semiconductor manufacturers to focus on high-performance, high capacity semiconductor devices. Examples of such high-performance, high capacity semiconductor devices include memory devices that can store data by switching between different resistance states according to an applied voltage or current. The semiconductor devices may include an RRAM (resistive random access memory), a PRAM (phase change random access memory), an FRAM (ferroelectric random access memory), an MRAM (magnetic random access memory), and an electronic fuse (E-fuse).

SUMMARY

The disclosed technology in this patent document relates to memory circuits or devices and their applications in semiconductor devices or systems. Various implementations of a semiconductor device can improve the performance of a semiconductor device and reduce manufacturing defects.

In one aspect, a semiconductor device for implementing the disclosed technology may include: a first conductive line extending in a first direction; a second conductive line disposed over the first conductive line to be spaced apart from the first conductive line and extending in a second direction crossing the first direction; and a selector layer disposed between the first conductive line and the second conductive line and extending in a direction crossing at least one of the first direction or the second direction, wherein the selector layer includes a trench formed on a surface of the selector layer and extending in the direction crossing at least one of the first direction or the second direction.

In another aspect, a method for fabricating a semiconductor device for implementing the disclosed technology may include: forming a first conductive line extending in a first direction; forming a second conductive line extending in a second direction crossing the first direction over the first conductive line to be spaced apart from the first conductive line; forming a partition pattern in a line shape extending in the second direction; forming, over the partition pattern, a selector material layer including a trench recessed in the first direction and extending in the second direction; forming a first dielectric layer to cover the selector material layer; and performing a planarization process on the first dielectric layer until a top surface of the first dielectric layer and a top surface of the selector material layer are exposed to form a selector layer in a line shape extending in the second direction and including the trench filled with the first dielectric layer.

The above and other aspects of the disclosed technology are disclosed in the drawings, the detailed description and the claims.

DETAILED DESCRIPTION

Figure 1A:
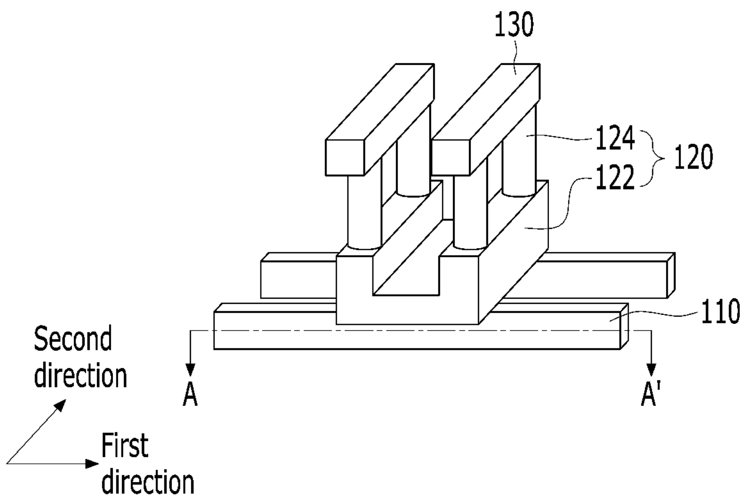
FIGS. 1A and 1B illustrate an example of a semiconductor device based on some implementations of the disclosed technology.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being “on” or “over” a second layer or “on” or “over” a substrate, the first layer may be directly formed on the second layer or the substrate but may also represent a structure where one or more other intermediate layers may exist between the first layer and the second layer or the substrate.

Figure 1B:
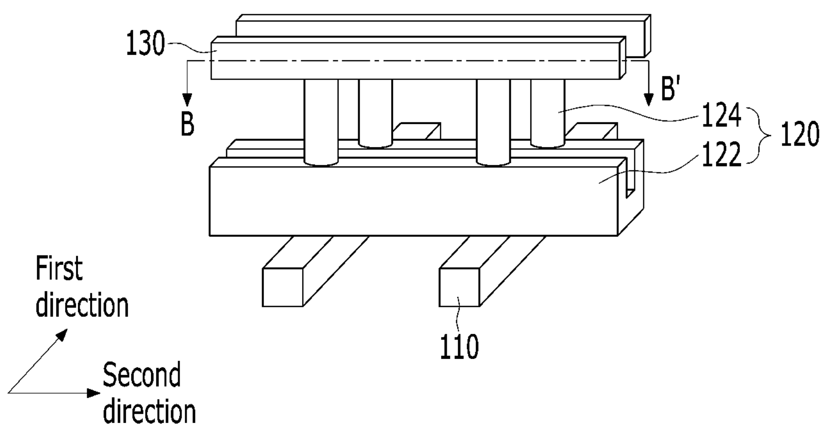

FIGS. 1A and 1B illustrate a semiconductor device based on some implementations of the disclosed technology.

Referring to FIGS. 1A and 1B, the semiconductor device may include a cross-point structure including a substrate 100, first conductive lines 110 formed over the substrate 100 and extending in a first direction, second conductive lines 130 formed over the first conductive lines 110 to be spaced apart from the first conductive lines 110 and extending in a second direction crossing the first direction, and memory cells 120 disposed at intersections of the first conductive lines 110 and the second conductive lines 130 between the first conductive lines 110 and the second conductive lines 130. In some implementations, the term “conductive line” can be used to indicate conductive structures (or conductive material structure) that electrically connect two or more circuit elements in the semiconductor memory. In some implementations, the conductive lines include word lines, which are used to control access to memory cells in the memory device, and bit lines, which are used to read out information stored in the memory cells. In some implementations, the conductive lines include interconnects that carry signals between different circuit elements in the semiconductor memory.

The substrate 100 may include a semiconductor material such as silicon. A required lower structure (not shown) may be formed in the substrate 100. For example, the substrate 100 may include a driving circuit (not shown) electrically connected to the first conductive lines 110 and/or the second conductive lines 130 to control operations of the memory cells 120. In some implementations, the conductive lines can indicate conductive structures that electrically connect two or more circuit elements in the semiconductor device. In some implementations, the conductive lines include word lines that are used to control access to memory cells in the memory device and bit lines that are used to read out information stored in the memory cells. In some implementations, the conductive lines include interconnects that carry signals between different circuit elements in the semiconductor device.

The first conductive lines 110 and the second conductive lines 130 may be connected to a lower end and an upper end of the memory cell 120, respectively, and may provide a voltage or a current to the memory cell 120 to perform read or write operations on the memory cell 120. When the first conductive lines 110 function as a word line, the second conductive lines 130 may function as a bit line. Conversely, when the first conductive lines 110 functions as a bit line, the second conductive lines 130 may function as a word line. The first conductive lines 110 and the second conductive lines 130 may include a single-layered structure or a multi-layered structure including one or more of various conductive materials. Examples of the conductive materials may include a metal, a metal nitride, or a conductive carbon material, or a combination thereof, but are not limited thereto. For example, the first conductive lines 110 and the second conductive lines 130 may include tungsten (W), titanium (Ti), tantalum (Ta), platinum (Pt), aluminum (Al), copper (Cu), zinc (Zn), nickel (Ni), cobalt (Co), lead (Pb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), carbon (C), silicon carbide (SiC), or silicon carbon nitride (SiCN), or a combination thereof.

The memory cell 120 may be arranged in a matrix (or matrix array) having rows and columns along the first direction and the second direction to overlap the intersection regions between the first conductive lines 110 and the second conductive lines 130. In an implementation, each of the memory cells 120 may have a size that is substantially equal to or smaller than that of the intersection region between each corresponding pair of the first conductive lines 110 and the second conductive lines 130. In another implementation, each of the memory cells 120 may have a size that is larger than that of the intersection region between each corresponding pair of the first conductive lines 110 and the second conductive lines 130.

Spaces between the first conductive lines 110, the second conductive lines 130 and the memory cell 120 may be filled with an insulating material.

The memory cell 120 may include a stacked structure including a selector layer 122 and a memory layer 124. The selector layer 122 may be formed in a line shape extending in a second direction and the memory layer 124 may be formed to overlap the intersection regions between the first conductive lines 110 and the second conductive lines 130 over the selector layer 122.

The selector layer 122 may be used to control access to the memory layer 124 by exhibiting different electrically conductive states and prevent a current leakage between the memory cells 120 sharing the first conductive line 110 or the second conductive line 130. For example, the selector layer 122 may have a threshold switching characteristic that blocks or substantially limits a current by using a low electrically conductive state of the selector layer (i.e., turning off the electrically conductive path through the selector layer) when a magnitude of an applied voltage to the selector layer is less than a predetermined threshold value and allows the current to increase rapidly by using a high electrically conductive state of the selector layer (i.e., turning on the electrically conductive path through the selector layer) when the magnitude of the applied voltage is equal to or greater than the predetermined threshold value. This threshold value may be referred to as a threshold voltage, and the selector layer 122 may controlled to be in either a turned-on or "on" state or high electrically conductive state to be electrically conductive or a turned-off or "off" state or low electrically conductive state to be electrically less-conductive than the "on" state or electrically non-conductive depending on whether the applied voltage is above or below the threshold voltage. Thus, the selector layer 122 exhibits different electrically conductive states to provide a switching operation to switch between the different electrically conductive states by controlling the applied voltage relative to the threshold voltage. The selector layer 122 may include a Metal Insulator Transition (MIT) material such as NbO2, TiO2, VO2, WO2, or others, a Mixed Ion-Electron Conducting (MIEC) material such as ZrO2 (Y2O3), Bi2O3-BaO, (La2O3)x (CeO2)1-x, or others, an Ovonic Threshold Switching (OTS) material including chalcogenide material such as Ge2Sb2Te5, As2Te3, As2, As2Se3, or others, or a tunneling insulating material such as silicon oxide, silicon nitride, a metal oxide, or others. A thickness of the tunneling insulating layer is sufficiently small to allow tunneling of electrons through the tunneling insulating layer under a given voltage or a given current. The selector layer 122 may include a single-layered structure or a multi-layered structure.

In some implementations, the selector layer 122 may perform a threshold switching operation through a doped region formed in a material layer or a selector material layer that will become the selector layer 122. Thus, a size of the threshold switching operation region may be controlled by a distribution area of the dopants. The dopants may form trap sites for capturing charge carriers in the material layer for the selector layer 122. The trap sites may capture the charge carriers moving in the selector layer 122 based on an external voltage applied to the selector layer 122. The trap sites thereby provide a threshold switching characteristic and are used to perform a threshold switching operation.

In some implementations, the selector layer 122 may include a dielectric material having incorporated dopants. The selector layer 122 may include an oxide with dopants, a nitride with dopants, or an oxynitride with dopants, or a combination thereof such as silicon oxide, titanium oxide, aluminum oxide, tungsten oxide, hafnium oxide, tantalum oxide, niobium oxide, silicon nitride, titanium nitride, aluminum nitride, tungsten nitride, hafnium nitride, tantalum nitride, niobium nitride, silicon oxynitride, titanium oxynitride, aluminum oxynitride, tungsten oxynitride, hafnium oxynitride, tantalum oxynitride, or niobium oxynitride, or a combination thereof. The dopants doped into the selector layer 122 may include an n-type dopant or a p-type dopant and be incorporated for example, by ion implantation process. Examples of the dopants may include one or more of boron (B), nitrogen (N), carbon (C), phosphorous (P), arsenic (As), aluminum (Al), silicon (Si) or germanium (Ge). For example, the selector layer 122 may include As-doped silicon oxide or Ge-doped silicon oxide.

In some implementations, the selector layer 122 may be coupled to each of the first conductive lines 110.

In some implementation, the selector layer 122 may be formed in a line shape with a trench in the middle over the first conductive lines 110. The selector layer 122 may extend in a direction crossing a direction in which any one adjacent to the selector layer 122 between the first conductive lines 110 and the second conductive lines 130 extend of the first conductive lines 110 and the second conductive lines 130 adjacent to the selector layer 122 extends. In some implementation, the selector layer 122 may extend in a direction crossing at least one of the first direction or the second direction.

In some implementation, since the selector layer 122 is adjacent to the first conductive lines 110, it may extend in a direction crossing the first direction in which the first conductive lines 110 extends. That is, the selector layer 122 may extend in the second direction in which the second conductive lines 130 extend. However, in another implementation, the selector layer 122 may be disposed adjacent to the second conductive lines 130 and extend in the first direction in which the first conductive lines 110 extend.

In some implementations, when forming a cross-point structure that includes a selector and a memory formed on an upper portion and a lower portion of the same element, it is very difficult to simultaneously etch the selector and the memory. As the pitch between memory cells decreases and the pillar height increases due to high integration density, it becomes difficult to remove the metal material redeposited on sidewalls and thus a shunt phenomenon in which a current freely flows inside the memory cells may be caused. In order to reduce an aspect ratio of the memory cell when patterning, the selector and the memory may be separately patterned. However, a spacer patterning technology (SPT) may need to be performed twice in order to pattern the selector and the memory separately, and a sidewall spacer layer may need to be formed, which increases the process time.

In order to address these issues, in some implementations of the disclosed technology, the selector layer 122 may be formed in a line shape with a trench in the middle by a patterning process. In some implementations, the process time and complexity can be reduced because of a large patterning size. In addition, since the selector layer 122 is formed using a method similar to a damascene process, deterioration of the selector layer 122 caused by etching can be prevented. Further, compared to a plate-type selector formed without using a patterning process, since the selector layer 122 has a line shape with a trench formed in the middle, the path length of a bypass current can be increased by twice the depth of the trench and an anisotropy can be imparted, thereby improving the selectivity of the selector layer 122.

The selector layer 122 may be in a groove shape with a trench in the middle when viewed in a cross-section taken along line A-A' of FIG. 1A and may be in a line shape with a trench in the middle when viewed in a cross-section taken along line B-B' of FIG. 1B.

The selector layer 122 may extend in a direction crossing a direction in which the any one adjacent to the selector layer 122 between the first conductive lines 110 and the second conductive lines 130, e.g., the first conductive lines 110 are formed in a line shape over the first conductive lines 110 and an insulating layer (not shown) between the first conductive lines 110 any one of the first conductive lines 110 and the second conductive lines 130 adjacent to the selector layer 122 extends, e.g., the selector layer 122 is formed in a line shape over the first conductive lines 110 and an insulating layer (not shown) between the first conductive lines 110.

In some implementation, the selector layer 122 may be formed by a giant line patterning process similar to the damascene process not by an etch process. Formation of the selector layer 122 will be described below with reference to FIGS. 2A to 2H.

The memory layer 124 may be used to store data by representing stored data using different resistance states and by switching between different resistance states according to an applied voltage or current. The memory layer 124 may have a single-layered structure or a multi-layered structure including at least one of materials having a variable resistance characteristic used for an RRAM, a PRAM, an MRAM, an FRAM, and others. For example, the memory layer 124 may include a metal oxide such as a transition metal oxide or a perovskite-based oxide, a phase change material such as a chalcogenide-based material, a ferromagnetic material, a ferroelectric material, or others. In some implementations, the memory layer 124 may include a magnetic tunnel junction (MTJ) structure. However, the implementations are not limited thereto, and the memory cell 120 may include other memory layers capable of storing data in various ways instead of the memory layer 124.

In some implementations, the memory layer 124 may be coupled to the selector layer 122.

The memory layer 124 may be formed at intersections between the first conductive lines 110 and the second conductive lines 130 over the selector layer 122.

In some implementations, the memory layer 124 may include an MTJ structure including a free layer having a variable magnetization direction, a pinned layer having a pinned magnetization direction and a tunnel barrier layer interposed between the free layer and the pinned layer.

The free layer may have one of different magnetization directions or one of different spin directions of electrons to switch the polarity of the free layer in the MTJ structure, resulting in changes in resistance value. In some implementations, the polarity of the free layer is changed or flipped upon application of a voltage or current signal (e.g., a driving current above a certain threshold) to the MTJ structure. With the polarity changes of the free layer, the free layer and the pinned layer have different magnetization directions or different spin directions of electron, which allows the memory layer 124 to store different data or represent different data bits. The free layer may also be referred as a storage layer. The magnetization direction of the free layer may be substantially perpendicular to a surface of the free layer, the tunnel barrier layer and the pinned layer. In other words, the magnetization direction of the free layer may be substantially parallel to stacking directions of the free layer, the tunnel barrier layer and the pinned layer. Therefore, the magnetization direction of the free layer may switch between a downward direction and an upward direction. The change in the magnetization direction of the free layer may be induced by a spin transfer torque generated by an applied current or voltage.

The pinned layer may have a pinned magnetization direction, which remains unchanged while the magnetization direction of the free layer changes. The pinned layer may be referred to as a reference layer. In some implementations, the magnetization direction of the pinned layer may be pinned in a downward direction. In some implementations, the magnetization direction of the pinned layer may be pinned in an upward direction.

The free layer and the pinned layer may have a single-layered structure or a multi-layered structure including a ferromagnetic material. For example, the pinned layer may include an alloy based on Fe, Ni or Co, for example, an Fe—Pt alloy, an Fe—Pd alloy, a Co—Pd alloy, a Co—Pt alloy, a Co—Fe alloy, an Fe—Ni—Pt alloy, a Co—Fe—Pt alloy, a Co—Ni—Pt alloy, or a Co—Fe—B alloy, or may include a stack of metals, such as Co/Pt, or Co/Pd or others.

The tunnel barrier layer may allow the tunneling of electrons in both data reading and data writing operations. The tunnel barrier layer may include a dielectric oxide such as MgO, CaO, SrO, TiO, VO, or NbO or others.

If a voltage or current is applied to the memory layer 124, the magnetization direction of the free layer may switch between a downward direction and an upward direction by spin transfer torque. In some implementations, when the magnetization directions of the free layer and the pinned layer are parallel to each other, the memory layer 124 may be in a low resistance state, and this may indicate digital data bit "0." Conversely, when the magnetization directions of the free layer and the pinned layer are anti-parallel to each other, the memory layer 124 may be in a high resistance state, and this may indicate a digital data bit "1." In some implementations, the memory layer 124 can be configured to store data bit '1' when the magnetization directions of the free layer and the pinned layer are parallel to each other and to store data bit '0' when the magnetization directions of the free layer and the pinned layer are anti-parallel to each other.

In some implementations, the memory layer 124 may further include one or more layers performing various functions to improve a characteristic of the MTJ structure. For example, the memory layer 124 may further include at least one of a buffer layer, an under layer, a spacer layer, a magnetic correction layer, and a capping layer.

In some implementations, each of the memory cells 120 includes the selector layer 122 and the memory layer 124 which are sequentially stacked. The structures of the memory cells 120 may be varied without being limited to one as shown in FIGS. 1A and 1B as long as the memory cells 120 have data storage properties. In some implementations, the relative position of the memory layer 124 and the selector layer 122 may be reversed. In some implementations, in addition to the layers 122 and 124, the memory cells 120 may further include one or more layers (not shown) for enhancing characteristics of the memory cells 120 or facilitating fabrication processes.

In some implementations, neighboring memory cells of the plurality of memory cells 120 may be spaced apart from each other at a predetermined interval, and trenches may be present between the plurality of memory cells 120. A trench between neighboring memory cells 120 may have a height to width ratio (e.g., an aspect ratio) in a range from 1:1 to 40:1, from 10:1 to 40:1, from 10:1 to 20:1, from 5:1 to 10:1, from 10:1 to 15:1, from 1:1 to 25:1, from 1:1 to 30:1, from 1:1 to 35:1, or from 1:1 to 45:1.

In some implementations, the trench may have sidewalls that are substantially perpendicular to an upper surface of the substrate 100. In some implementations, neighboring trenches may be spaced apart from each other by an equal or similar distance.

Although one cross-point structure has been described, two or more cross-point structures may be stacked in a vertical direction perpendicular to a top surface of the substrate 100.

In some implementations, a semiconductor device can be fabricated as will be discussed below with reference to FIGS. 2A to 2H. FIGS. 2A to 2H are cross-sectional views taken along line A-A' of FIG. 1A. The explanation similar to those described with reference to FIGS. 1A and 1B will be omitted.

Figure 2A:
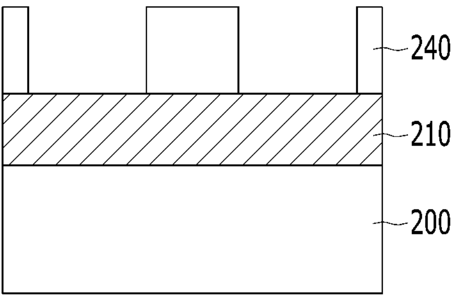
FIGS. 2A to 2H are cross-sectional views illustrating an example method for fabricating a semiconductor device based on some implementations of the disclosed technology.

Referring to FIG. 2A, first conductive lines 210 may be formed over a substrate 200 in which a predetermined structure is formed. For example, the first conductive lines 210 may be formed by forming an insulating layer (not shown) having a trench for forming the first conductive lines 210, forming a conductive layer for the first conductive lines 210 in the trench and etching the conductive layer using a mask pattern in a line shape extending in a first direction.

Then, a plurality of partition patterns 240 may be formed to be spaced apart from each other over each of the first conductive lines 210.

The partition patterns 240 may be conformally covered with a material layer 222A to form the selector layer 222 with a trench in the middle in a subsequent process.

The partition patterns 240 may be formed in a line shape extending in a direction crossing a direction in which the first conductive lines 210 extend. Neighboring partition patterns of the partition patterns 240 may be spaced apart from each other.

The partition patterns 240 may include an insulating material. In some implementations, the partition patterns 240 may include an oxide, or a nitride, or a combination thereof.

The partition patterns 240 may be formed by forming an insulating layer for the partition patterns 240 over the first conductive lines 210 and etching the insulating layer using a mask pattern.

Figure 2B:
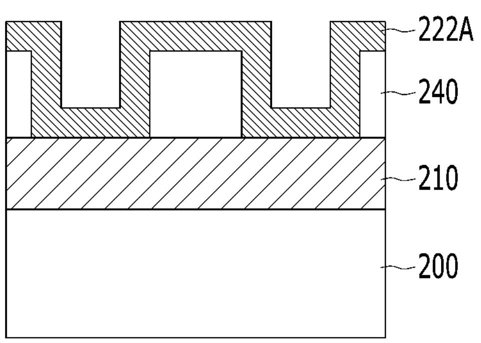

Referring to FIG. 2B, the material layer 222A for the selector layer 222 may be formed to conformally cover the partition patterns 240.

Spaces between vertical branches of the material layer 222A in FIG. 2B may correspond to a trench formed in the middle of the selector layer 222 in a subsequent process.

The material layer 222A may include a Metal Insulator Transition (MIT) material, a Mixed Ion-Electron Conducting (MIEC) material, an Ovonic Threshold Switching (OTS) material including a chalcogenide material, a tunneling insulating material or others.

In some implementations, when the selector layer 222 includes an ion implanted insulating material, the material layer 222A may be formed by forming a matrix layer including the insulating material and incorporating a dopant into the matrix layer by an ion implantation process.

In some implementations, the material layer 222A may include an oxide with dopants, a nitride with dopants, or an oxynitride with dopants, or a combination thereof such as silicon oxide, titanium oxide, aluminum oxide, tungsten oxide, hafnium oxide, tantalum oxide, niobium oxide, silicon nitride, titanium nitride, aluminum nitride, tungsten nitride, hafnium nitride, tantalum nitride, niobium nitride, silicon oxynitride, titanium oxynitride, aluminum oxynitride, tungsten oxynitride, hafnium oxynitride, tantalum oxynitride, or niobium oxynitride, or a combination thereof. The dopants doped into the material layer 222A may include an n-type dopant or a p-type dopant and be incorporated for example, by ion implantation process. Examples of the dopants may include one or more of boron (B), nitrogen (N), carbon (C), phosphorous (P), arsenic (As), aluminum (Al), silicon (Si) or germanium (Ge). For example, the material layer 222A may include As-doped silicon oxide or Ge-doped silicon oxide.

Figure 2C:
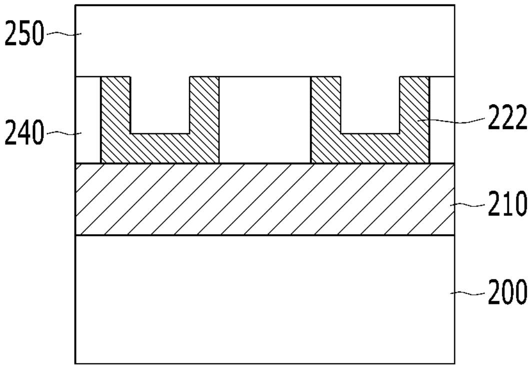
Figure 2D:
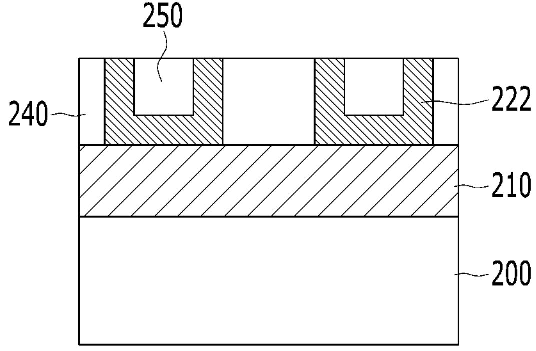

Referring to FIG. 2C, a planarization process may be performed to expose the partition patterns 240.

The planarization process may be performed by, for example, a chemical mechanical planarization process.

Through the above process, the selector layer 222 with the trench in the middle may be formed. The selector layer 222 may be formed in a line shape extending in a direction crossing a direction in which the first conductive lines 210 extend.

Then, a first dielectric layer 250 may be formed over the structure in which the planarization process is performed.

The first dielectric layer 250 may include an insulating material. In some implementations, the first dielectric layer 250 may include an oxide, or a nitride, or a combination thereof.

In some implementations, the first dielectric layer 250 and the partition patterns 240 may include the same material as each other.

In another implementation, the first dielectric layer 250 and the partition patterns 240 may include different materials from each other.

In some implementation, before forming the first dielectric layer 250, the planarization process may be performed on the material layer 222A to expose the partition patterns 240. In another implementation, such a planarization process may be omitted. Even though the planarization process is omitted before forming the first dielectric layer 250, another planarization process may be performed after forming the first dielectric layer 250 to expose the partition patterns 240 and the selector layer 222 as described below with reference to FIG. 2D, Referring to FIG. 2D, a planarization process may be performed to expose the partition patterns 240 and the selector layer 222.

The planarization process may be performed by, for example, a chemical mechanical planarization process.

Through the above processes, the first dielectric layer 250 may fill the trench formed in the middle of the selector layer 222.

Figure 2E:
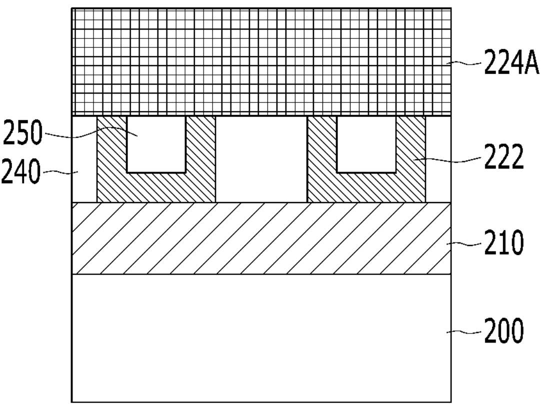

Referring to FIG. 2E, a material layer 224A for a memory layer 224 may be formed over the partition patterns 240, the selector layer 222 and the first dielectric layer 250.

The material layer 224A may have a single-layered structure or a multi-layered structure including at least one of materials having a variable resistance characteristic used for an RRAM, a PRAM, an MRAM, an FRAM, and others. In some implementations, the material layer 224A may include a metal oxide such as a transition metal oxide or a perovskite-based oxide, a phase change material such as a chalcogenide-based material, a ferromagnetic material, a ferroelectric material, or others. In some implementations, the material layer 224A may include an MTJ structure.

Figure 2F:
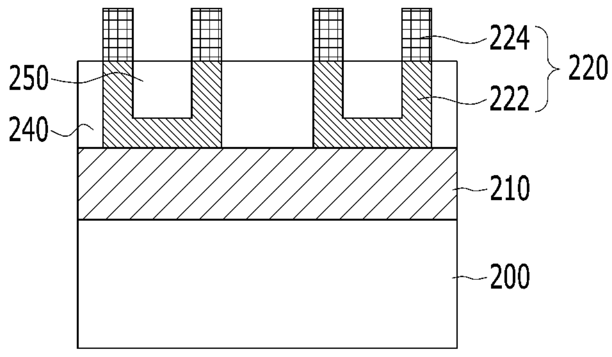

Referring to FIG. 2F, a memory layer 224 may be formed by patterning the material layer 224A using a mask pattern (not shown).

The memory layer 224 may be formed over an exposed top surface of the selector layer 222 and may be coupled to the selector layer 222. That is, the memory layer 224 may be formed to overlap the intersection regions between the first conductive lines 210 and the second conductive layer lines 230 over the selector layer 222.

The selector layer 222 and the memory layer 224 may form a memory cell 220.

Figure 2G:
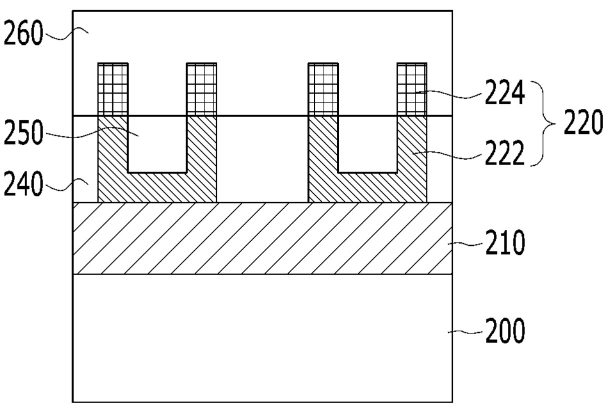

Referring to FIG. 2G, a second dielectric layer 260 may be formed to cover the structure of FIG. 2F.

The second dielectric layer 260 may include an insulating material. In some implementations, the second dielectric layer 260 may include an oxide, or a nitride, or a combination thereof.

In some implementations, the second dielectric layer 260, the first dielectric layer 250 and the partition patterns 240 may include the same material as each other.

In another implementation, the second dielectric layer 260, the first dielectric layer 250 and the partition patterns 240 may include different materials from each other.

Figure 2H:
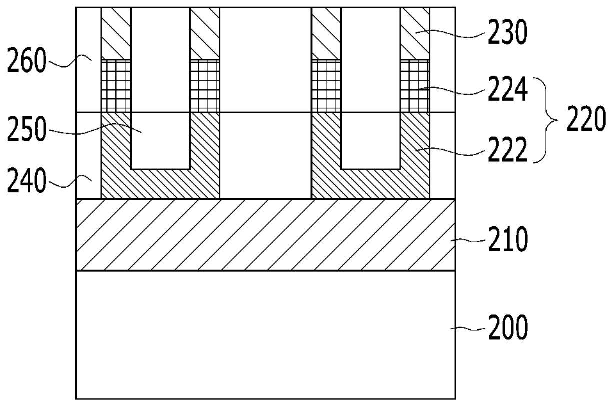

Referring to FIG. 2H, second conducive lines 230 may be formed over the memory layer 224.

The second conducive lines 230 may be formed by forming a trench for forming the second conducive lines 230 in the second dielectric layer 260, depositing a conductive material in the trench and etching the conductive material by using a mask pattern (not shown) in a line shape extending in a second direction.

Through the above processes, a semiconductor device including the substrate 200, the first conductive lines 210, the memory cell 220 and the second conducive lines 230 may be formed. The memory cell 220 may include the selector layer 222 and the memory layer 224. The memory layer 224 may be formed to overlap the intersection regions between the first conductive lines 210 and the second conducive lines 230 over the selector layer 222. The selector layer 222 may have a line shape extending in the second direction (e.g., a direction crossing a direction in which the first conductive lines 210 extend) and having a trench in the middle.

In some implementations, since the selector layer 222 is formed using a method similar to the damascene technique, the process time can be reduced and deterioration of the selector layer 122 that otherwise would have been caused by etching can be prevented. Further, different from a plate-type selector formed without using a patterning process, since the selector layer 222 has a line shape with a trench formed in the middle, the path length of a bypass current can be increased by twice the depth of the trench and an anisotropy can be imparted, thereby implementing the selector layer 122 having a higher selectivity.

The substrate 200, the first conductive lines 210, the memory cell 220, the selector layer 222, the memory layer 224 and the second conducive lines 230 shown in FIG. 2H may correspond to the substrate 100, the first conductive lines 110, the memory cell 120, the selector layer 122, the memory layer 124 and the second conductive lines 130 shown in FIGS. 1A and 1B, respectively.

Figure 3A:
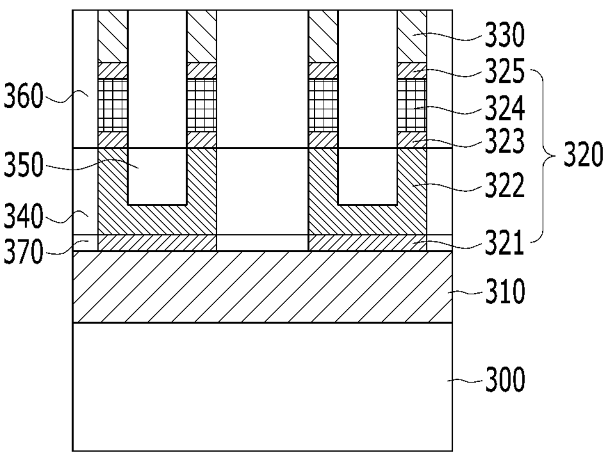
FIGS. 3A and 3B illustrate another example of a semiconductor device based on some implementations of the disclosed technology.
Figure 3B:
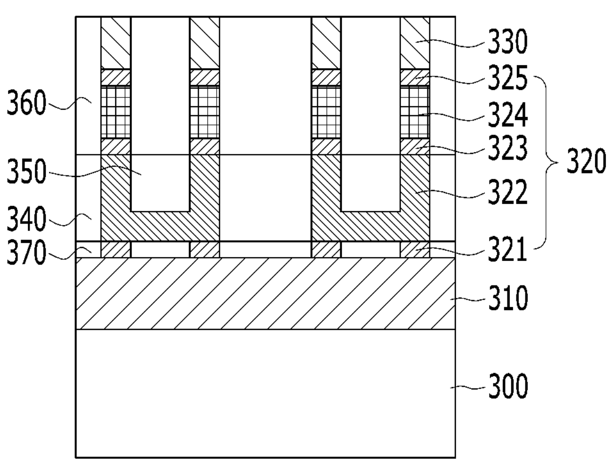

FIGS. 3A and 3B illustrate another example of a semiconductor device based on some implementations of the disclosed technology.

The implementations shown in FIGS. 3A and 3B are similar to the implementations shown in FIGS. 1A and 1B, and FIGS. 2A to 2H except that a lower electrode layer 321, a middle electrode layer 323 and an upper electrode layer 325 are further included. The explanation similar to those explained with reference to FIGS. 1A and 1B, and FIGS. 2A to 2H will be omitted.

Referring to FIG. 3A, the semiconductor device may include a substrate 300, first conductive lines 310, a memory cell 320 and second conductive layer lines 330. The memory cell 320 may include the lower electrode layer 321, a selector layer 322, the middle electrode layer 323, a memory layer 324 and the upper electrode layer 325.

The memory layer 324 may be formed to overlap the intersection regions between the first conductive lines 310 and the second conductive layer lines 330 over the middle electrode layer 323.

The selector layer 322 may have a line shape extending in a second direction (e.g., a direction crossing a first direction in which the first conductive lines 310 extend) over the first conductive lines 310 and having a trench in the middle.

The lower electrode layer 321 may be formed to entirely overlap a bottom surface of the selector layer 322 over the first conductive lines 310. The lower electrode layer 321 may be disposed at a lowermost portion of the memory cell 320. The lower electrode layer 321 may function as a circuit node that carries a current or applies a voltage between one of the first conductive lines 310 and the remaining portion (e.g., the elements 322, 323, 324 and 325) of each of the memory cells 320.

The middle electrode layer 323 may be interposed between the selector layer 322 and the memory layer 324. The middle electrode layer 323 may electrically connect the selector layer 322 and the memory layer 324 to each other while physically isolating or separating the selector layer 322 and the memory layer 324 from each other.

The upper electrode layer 325 may be disposed at an uppermost portion of the memory cell 320 and function as a transmission path of electrical signals such as a voltage or a current between a material layer in the memory cell 320 and one of the second conductive lines 330.

The lower electrode layer 321, the middle electrode layer 323 and the upper electrode layer 325 may include a single-layered structure or a multi-layered structure including various conductive materials such as a metal, a metal nitride, a conductive carbon material, or a combination thereof, respectively. For example, the lower electrode layer 321, the middle electrode layer 323 and the upper electrode layer 325 may include tungsten (W), titanium (Ti), tantalum (Ta), platinum (Pt), aluminum (Al), copper (Cu), zinc (Zn), nickel (Ni), cobalt (Co), lead (Pb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), carbon (C), silicon carbide (SiC), or silicon carbon nitride (SiCN), or a combination thereof.

The lower electrode layer 321, the middle electrode layer 323 and the upper electrode layer 325 may include the same material as each other or different materials from each other.

The lower electrode layer 321, the middle electrode layer 323 and the upper electrode layer 325 may have the same thickness as each other or different thicknesses from each other.

The semiconductor device shown in FIG. 3A may be formed by a process similar to the process shown in FIGS. 2A to 2H.

The first conductive lines 310 may be formed over the substrate 300 and then the lower electrode layer 321 may be formed over the first conductive lines 310. The lower electrode layer 321 may be formed by forming an interlayer dielectric layer 370 having a hole over the structure in which the first conductive lines 310 are formed, forming a material layer for forming the lower electrode layer 321 in the hole and performing a planarization process such as a chemical mechanical planarization process.

Then, the selector layer 322 may be formed by a method similar to the method shown in FIGS. 2A to 2D. The middle electrode layer 323, the memory layer 324 and the upper electrode layer 325 which are sequentially stacked and overlap the intersection regions between the first conductive lines 310 and the second conductive layer lines 330 over the selector layer 322 may be formed by sequentially forming a material layer for the middle electrode layer 323, a material layer for the memory layer 324 and a material layer for the upper electrode layer 325 over a partition pattern 340, the selector layer 322 and a first dielectric layer 350, and patterning the material layer 325, the material layer 324 and the material layer 323.

Then, a second dielectric layer 360 and the second conductive layer lines 330 may be formed by a method similar to the method shown in FIGS. 2G and 2H.

In some implementations, the middle electrode layer 323, the memory layer 324 and the upper electrode layer 325 are formed by one process. In another implementation, the middle electrode layer 323, the memory layer 324 and the upper electrode layer 325 may be formed by a separate process. In another implementation, at least two of the middle electrode layer 323, the memory layer 324 and the upper electrode layer 325 may be formed by one process. For example, a middle electrode layer 323 may be formed by forming an interlayer dielectric layer having a hole over the structure in which the selector layer 322 is formed, forming a material layer for forming the middle electrode layer 323 in the hole and performing a planarization process, then memory layer 324 may be formed by forming a material layer for the memory layer 324 over the structure in which the middle electrode layer 323 is formed and patterning the material layer, and then the upper electrode layer 325 may be formed by forming an interlayer dielectric layer having a hole over the structure in which the memory layer 324 is formed and performing a planarization process. In another implementations, the middle electrode layer 323 and the memory layer 324 may be formed by sequentially forming a material layer for forming the middle electrode layer 323 and a material layer for forming the memory layer 324 over the structure in which the selector layer 322 is formed and patterning the material layers, and then the upper electrode layer 325 may be formed by the method described above.

The implementation shown in FIG. 3B is similar to the implementation shown in FIG. 3A except that a lower electrode layer 321 may be formed to overlap the intersection regions between the first conductive lines 310 and the second conductive layer lines 330 over the first conductive lines 310 instead of entirely covering a bottom surface of a selector layer 322. The explanation similar to those explained with reference to FIGS. 1A and 1B, FIGS. 2A to 2H, and FIG. 3A will be omitted.

Referring to FIG. 3B, the semiconductor device may include a substrate 300, the first conductive lines 310, a memory cell 320 and the second conductive layer lines 330. The memory cell 320 may include the lower electrode layer 321, a selector layer 322, a middle electrode layer 323, a memory layer 324 and an upper electrode layer 325.

The memory layer 324 may be formed to overlap the intersection regions between the first conductive lines 310 and the second conductive layer lines 330 over the middle electrode layer 323.

The selector layer 322 may have a line shape extending in a second direction (e.g., a direction crossing a first direction in which the first conductive lines 310 extend) over the first conductive lines 310 and having a trench formed in the middle.

The lower electrode layer 321 may be formed to overlap the intersection regions between the first conductive lines 310 and the second conductive layer lines 330 over the first conductive lines 310. That is, the lower electrode layer 321 may be disposed only at intersection between the first conductive lines 310 and the second conductive layer lines 330 and may partially overlap the bottom surface of the selector layer 322. The lower electrode layer 321 may be disposed at a lowermost portion of the memory cell 320. The lower electrode layer 321 may function as a circuit node that carries a current or applies a voltage between one of the first conductive lines 310 and the remaining portion (e.g., the elements 322, 323, 324 and 325) of each of the memory cells 320.

The middle electrode layer 323 may be interposed between the selector layer 322 and the memory layer 324. The middle electrode layer 323 may electrically connect the selector layer 322 and the memory layer 324 to each other while physically isolating or separating the selector layer 322 and the memory layer 324 from each other.

The upper electrode layer 325 may be disposed at an uppermost portion of the memory cell 320 and function as a transmission path of electrical signals such as a voltage or a current between a material layer in the memory cell 320 and one of the second conductive lines 330.

The substrate 300, the first conductive lines 310, the memory cell 320, the selector layer 322, the memory layer 224 and the second conducive lines 230 shown in FIGS. 3A and 3B may correspond to the substrate 200, the first conductive lines 210, the memory cell 220, the selector layer 222, the memory layer 224 and the second conducive lines 230 shown in FIG. 2H, respectively, and the substrate 100, the first conductive lines 110, the memory cell 120, the selector layer 122, the memory layer 124 and the second conductive lines 130 shown in FIGS. 1A and 1B.

The semiconductor device shown in FIGS. 3A and 3B may include all of the lower electrode layer 321, the middle electrode layer 323 and the upper electrode layer 325. In another implementation, at least one of the lower electrode layer 321, the middle electrode layer 323 and the upper electrode layer 325 may be omitted. In some implementations, when the lower electrode layer 321 is omitted, the first conductive lines 310 may function as a lower electrode layer 321. In another implementation, when the upper electrode layer 325 is omitted, the second conductive layer lines 330 may function as the upper electrode layer 325.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few embodiments and examples are described. Enhancements and variations of the disclosed embodiments and other embodiments can be made based on what is described and illustrated in this patent document.

What is claimed is:

1. A semiconductor device, comprising:

a first conductive line extending in a first direction;

a second conductive line disposed over the first conductive line to be spaced apart from the first conductive line and extending in a second direction crossing the first direction;

a selector layer disposed between the first conductive line and the second conductive line and extending in a direction crossing at least one of the first direction or the second direction, wherein the selector layer includes a trench formed on a surface of the selector layer and extending in the direction crossing at least one of the first direction or the second direction; and a dielectric layer disposed in the trench.

2. The semiconductor device according to claim 1, wherein the selector layer includes at least one of a metal insulator transition material, a mixed ion-electron conducting material, an ovonic threshold switching material including a chalcogenide material, a tunneling insulating material, or an ion-implanted insulating material.

3. The semiconductor device according to claim 1, further comprising a memory layer disposed between the selector layer and the second conductive line.

4. The semiconductor device according to claim 3, wherein the memory layer is disposed to overlap an intersection region between the first conductive line and the second conductive line.

5. The semiconductor device according to claim 3, wherein the memory layer includes a variable resistance material, a phase change material, a ferroelectric material, or a ferromagnetic material.

6. The semiconductor device according to claim 3, further comprising at least one of a first electrode layer disposed between the first conductive line and the selector layer, a second electrode layer disposed between the selector layer and the memory layer, a third electrode layer disposed between the second conductive line and the memory layer.

7. The semiconductor device according to claim 6, wherein the first electrode layer overlaps a bottom surface of the selector layer.

8. The semiconductor device according to claim 6, wherein the first electrode layer overlaps an intersection region between the first conductive line and the second conductive line and at least partially overlaps a bottom surface of the selector layer.

9. The semiconductor device according to claim 1, further comprising a partition pattern disposed on sidewalls of the selector layer.

10. The semiconductor device according to claim 9, wherein the dielectric layer and the partition pattern include a same material as each other.

* * * * *